(12) United States Patent
Qiaoming et al.

(10) Patent No.: US 12,068,233 B2
(45) Date of Patent: Aug. 20, 2024

(54) ADAPTER BOARD AND METHOD FOR FORMING SAME, PACKAGING METHOD, AND PACKAGE STRUCTURE

(71) Applicant: Semiconductor Manufacturing North China (Beijing) Corporation, Beijing (CN)

(72) Inventors: Cai Qiaoming, Beijing (CN); Yang Lie Yong, Beijing (CN); Chen Wei, Beijing (CN); Lu Xiao Yu, Beijing (CN)

(73) Assignee: Semiconductor Manufacturing North China (Beijing) Corporation, Beijing (CN)

(*) Notice: Subject to any disclaimer, the term of this patent is extended or adjusted under 35 U.S.C. 154(b) by 0 days.

(21) Appl. No.: 18/124,069

(22) Filed: Mar. 21, 2023

(65) Prior Publication Data

US 2023/0223329 A1    Jul. 13, 2023

Related U.S. Application Data

(62) Division of application No. 17/155,450, filed on Jan. 22, 2021, now Pat. No. 11,637,059.

(30) Foreign Application Priority Data

Jun. 22, 2020  (CN) .......................... 202010571641.8

(51) Int. Cl.
| H01L 23/498 | (2006.01) |
| H01L 21/48 | (2006.01) |
| H01L 23/00 | (2006.01) |
| H01L 23/64 | (2006.01) |
| H01L 49/02 | (2006.01) |

(52) U.S. Cl.
CPC .... *H01L 23/49838* (2013.01); *H01L 21/4857* (2013.01); *H01L 21/486* (2013.01); *H01L 23/49822* (2013.01); *H01L 23/642* (2013.01); *H01L 24/81* (2013.01); *H01L 28/91* (2013.01); *H01L 28/92* (2013.01); *H01L 2224/8136* (2013.01)

(58) Field of Classification Search
None
See application file for complete search history.

(56) References Cited

U.S. PATENT DOCUMENTS

| 6,723,600 B2* | 4/2004 | Wong ...................... H01L 28/60 438/626 |
| 7,435,627 B2 | 10/2008 | Horton |
| 7,791,168 B2* | 9/2010 | Horton .............. H01L 23/49822 257/532 |
| 11,887,943 B2* | 1/2024 | Huang ................ H01L 21/4857 |

* cited by examiner

*Primary Examiner* — Long Pham
(74) *Attorney, Agent, or Firm* — Crowell & Moring LLP

(57) ABSTRACT

Provided are an adapter board and a method for forming the same, a packaging method, and a package structure. One form of a method for forming an adapter board includes: providing a base, including an interconnect region and a capacitor region, the base including a front surface and a rear surface that are opposite each other; etching the front surface of the base, to form a first trench in the base of the interconnect region and form a second trench in the base of the capacitor region; forming a capacitor in the second trench; etching a partial thickness of the base under the first trench, to form a conductive via; forming a via interconnect structure in the conductive via; and thinning the rear surface of the base, to expose the via interconnect structure.

12 Claims, 5 Drawing Sheets

ADAPTER BOARD AND METHOD FOR FORMING SAME, PACKAGING METHOD, AND PACKAGE STRUCTURE

RELATED APPLICATIONS

The present application is a divisional of U.S. application Ser. No. 17/155,450, filed Jan. 22, 2021 (still pending), which claims priority to Chinese Patent Appln. No. 202010571641.8, filed Jun. 22, 2020, the entire disclosure of each of which is hereby incorporated by reference.

BACKGROUND

Technical Field

Embodiments and implementations of the present disclosure relate to the field of semiconductor manufacturing, and in particular, to an adapter board and a method for forming the same, a packaging method, and a package structure.

Related Art

With the advancement of technologies, a three-dimensional (3D) integrated circuit (or a 2.5D integrated circuit or the like) based on a silicon interposer has become a most promising solution to enhance the system performance, reduce power consumption, and support heterogeneous integration.

The silicon interposer is a connecting structure that is made of a silicon chip and is similar to a circuit board (for example, a printed circuit board (PCB)). However, a line width, a node spacing, and the like of the silicon interposer are less than those of a circuit board. Chips with different functions, for example, a central processing unit (CPU) and a dynamic random access memory (DRAM), can be connected to one same silicon interposer. Therefore, a lot of operation and data exchange can be completed through the silicon interposer. In this way, electricity can be saved, and bandwidth can be increased. In addition, the silicon interposer further has advantages such as a reduced signal length, applicability to heterogeneous integration, and an increase in the yield of a system on chip (SOC) product.

Similar to the PCB, the silicon interposer usually has a through silicon via (TSV) interconnect structure. Results obtained through a combined operation between different chips can be transmitted, through the TSV, to a circuit board connected to the chips. Therefore, the silicon interposer is equivalent to a bridge connecting a plurality of chips to one same circuit board.

SUMMARY

Embodiments and implementations of the present disclosure provide an adapter board and a method for forming the same, a packaging method, and a package structure, to improve the performance of a device.

To address the foregoing problem, one form of the present disclosure provides a method for forming an adapter board, including: providing a base, including an interconnect region used for forming a via interconnect structure thereon and a capacitor region used for forming a capacitor thereon, the base including a front surface and a rear surface that are opposite each other; etching the front surface of the base, to form a first trench in the base of the interconnect region and form a second trench in the base of the capacitor region; forming a capacitor in the second trench, the capacitor including a first electrode located on the side walls and bottom of the second trench, a capacitor dielectric layer located on the first electrode, and a second electrode located on the capacitor dielectric layer, the second electrode filling the second trench; etching a partial thickness of the base under the first trench after the capacitor is formed, to form a groove in the base, the groove and the first trench forming a conductive via; forming a via interconnect structure in the conductive via; and thinning the rear surface of the base, to expose the via interconnect structure from the rear surface of the base.

Another form of the present disclosure provides a packaging method, including: providing a circuit board; bonding the adapter board provided in the implementations of the present disclosure to the circuit board, to electrically connect the via interconnect structure to the circuit board, the rear surface of the base being arranged opposite the circuit board; providing a chip; and bonding the chip to the adapter board formed using the method for forming an adapter board provided in embodiments and implementations of the present disclosure, to electrically connect the chip to the capacitor and to electrically connect the chip to the via interconnect structure, the chip being located on the front surface of the base.

Yet another form of the present disclosure provides an adapter board, including: a base, including an interconnect region used for forming a via interconnect structure thereon and a capacitor region used for forming a capacitor thereon, the base including a front surface and a rear surface that are opposite each other; a capacitor, located in a partial thickness of a base of the capacitor region, the capacitor including a first electrode in contact with the base, a capacitor dielectric layer located on the first electrode, and a second electrode located on the capacitor dielectric layer, the side walls of the second electrode being in contact with each other, the top surface of the capacitor being opposite the rear surface of the base; and a via interconnect structure, running through the base of the interconnect region.

A further form of the present disclosure provides a package structure, including: a circuit board; the adapter board provided in the implementations of the present disclosure, bonded to the circuit board, to electrically connect the via interconnect structure to the circuit board, the rear surface of the base being arranged opposite the circuit board; and a chip, bonded to the adapter board, to electrically connect the chip to the capacitor and to electrically connect the chip to the via interconnect structure, the chip being located on the front surface of the base.

Compared with the prior art, technical solutions of embodiments and implementations of the present disclosure have the following advantages.

In forms of a method for forming an adapter board provided in the embodiments of the present disclosure, a front surface of a base is etched, so that a first trench is formed in the base of an interconnect region and a second trench is formed in the base of a capacitor region. Next, a capacitor is formed in the second trench, and a partial thickness of the base under the first trench is etched, to form a groove in the base, the groove and the first trench forming a conductive via, a via interconnect structure being formed in the conductive via. Therefore, in embodiments and implementations of the present disclosure, the capacitor is further formed in the adapter board, so that a process of forming the capacitor and a process of forming the adapter board are integrated, and an additional step of forming the capacitor is omitted, which is beneficial to reduce processes and improve the process integration, and is further beneficial to reduce process costs and shorten the production cycle. Moreover, the capacitor is further formed in the adapter board provided in embodiments and implementations of the present disclosure, which is beneficial to improve the functional diversity of the adapter board, so that an application scenario of the adapter board is diversified.

In forms of a packaging method provided in embodiments and implementations of the present disclosure, the adapter board formed using a method for forming an adapter board provided in embodiments and implementations of the present disclosure is bonded to the circuit board, to electrically connect the via interconnect structure to the circuit board, to bond the chip to the adapter board, to electrically connect the chip to the capacitor, and to electrically connect the chip to the via interconnect structure. The front surface of the base is arranged opposite the chip, and the rear surface of the base is arranged opposite the circuit board. Compared with a solution in which the capacitor is bonded to the circuit board and the capacitor is located between the adapter board and the circuit board, in a solution in which the capacitor is formed in the adapter board in embodiments and implementations of the present disclosure, the distance between the capacitor and the chip is shorter, which is beneficial to improve RC delay of a device and increase a signal transmission rate, and further improve the performance of the device.

DETAILED DESCRIPTION

A device formed with conventional methods for forming adaptor boards still has a problem of inadequate performance. The reason for the inadequate performance of the device is analyzed with reference to a package structure.

Figure 1:
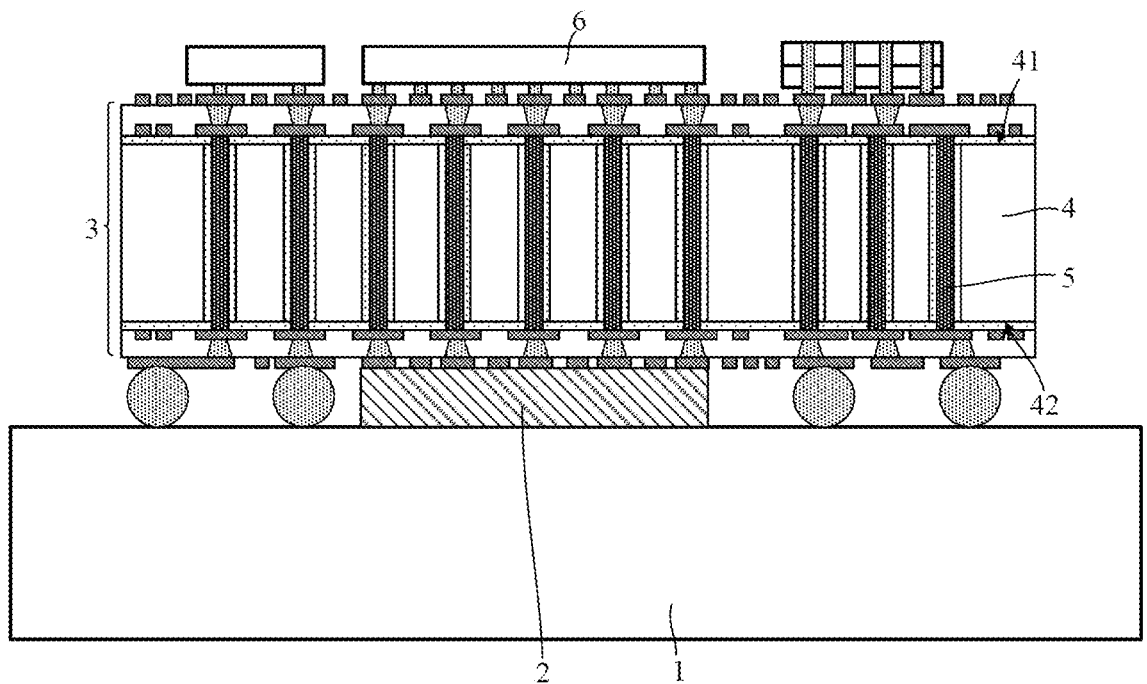
FIG. 1 is a schematic structural diagram of a package structure.

FIG. 1 is a schematic structural diagram of a package structure.

The package structure includes; a circuit board 1; a capacitor 2, bonded to the circuit board 1, and electrically connected to the circuit board 1; an adapter board 3, the adapter board 3 including a base 4 and a via interconnect structure 5 running through the base 4, the base 4 including a front surface 41 and a rear surface 42 that are opposite to each other, the rear surface of the base 4 being bonded to the circuit board 1 and being located on the capacitor 2, the via interconnect structure 5 being electrically connected to the circuit board 1, the via interconnect structure 5 being further electrically connected to the capacitor 2; and a chip 6, bonded to the front surface 41 of the base 4, the chip 6 being electrically connected to the capacitor 2, the chip 6 being electrically connected to the via interconnect structure 5.

In the package structure, the capacitor 2 is bonded to the circuit board 1, the capacitor 2 is located between the adapter board 3 and the circuit board 1, and the capacitor 2 is far away from the chip 6. Consequently, a signal delay problem between the capacitor 2 and the chip 6 tends to deteriorate and power consumption tends to increase. For example, when the chip 6 is a CPU, the performance of a device tends to decrease. In addition, in a process of forming the package structure by bonding the capacitor 2 to the circuit board 1, an additional process of forming the capacitor 2 further needs to be separately performed, resulting in a complex process and high process costs.

To address the technical problem, one form of the present disclosure provides a method for forming an adapter board, including: providing a base, including an interconnect region used for forming a via interconnect structure thereon and a capacitor region used for forming a capacitor thereon, the base including a front surface and a rear surface that are opposite to each other; etching the front surface of the base, to form a first trench in the base of the interconnect region and form a second trench in the base of the capacitor region; forming a capacitor in the second trench, the capacitor including a first electrode located on the side walls and bottom of the second trench, a capacitor dielectric layer located on the first electrode, and a second electrode located on the capacitor dielectric layer, the second electrode filling the second trench; etching a partial thickness of the base under the first trench after the capacitor is formed, to form a groove in the base, the groove and the first trench forming a conductive via; forming a via interconnect structure in the conductive via; and thinning the rear surface of the base, to expose the via interconnect structure from the rear surface of the base.

In implementations of the method for forming an adapter board provided in the present disclosure, a front surface of a base is etched, so that a first trench is formed in the base of an interconnect region and a second trench is formed in the base of a capacitor region. Next, a capacitor is formed in the second trench, and a partial thickness of the base under the first trench is etched, to form a groove in the base, the groove and the first trench forming a conductive via, a via interconnect structure being formed in the conductive via. Therefore, in some implementations, the capacitor is further formed in the adapter board, so that a process of forming the capacitor and a process of forming the adapter board are integrated, and an additional step of forming the capacitor is omitted, which is beneficial to reduce processes and improve the process integration, and is further beneficial to reduce process costs and shorten the production cycle. Moreover, the capacitor is further formed in the adapter board provided in some implementations, which is beneficial to improve the functional diversity of the adapter board, so that an application scenario of the adapter board is diversified.

To make the foregoing objectives, features, and advantages of embodiments and implementations of the present disclosure more apparent and easier to understand, specific embodiments and implementations of the present disclosure are described in detail below with reference to the accompanying drawings.

FIG. 2 to FIG. 9 are schematic structural diagrams corresponding to steps in one form of a method for forming an adapter board according to the present disclosure.

Figure 2:
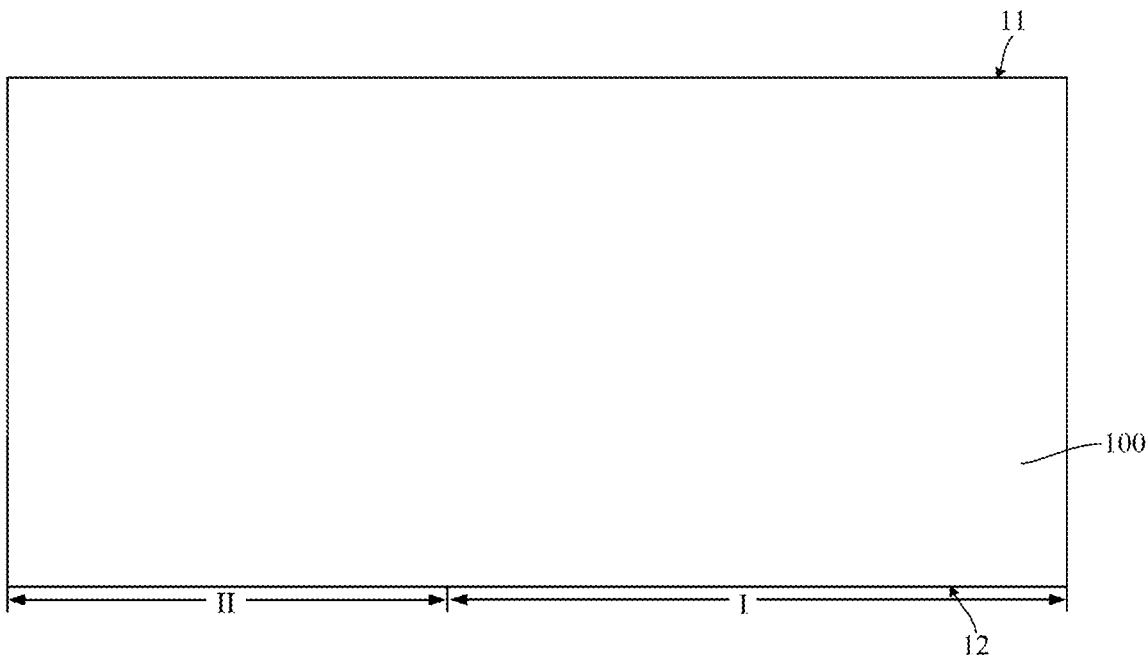
FIG. 2 to FIG. 9 are schematic structural diagrams corresponding to steps in one form of a method for forming an adapter board according to the present disclosure.

Referring to FIG. 2, a base 100 is provided, including an interconnect region I used for forming a via interconnect structure thereon and a capacitor region II used for forming a capacitor thereon. The base 100 includes a front surface 11 and a rear surface 12 that are opposite each other.

The base 100 is used for providing a platform for subsequent processes.

In some implementations, the base 100 is used as an interposer and is used for isolating the via interconnect structure from the capacitor.

In an example, the base 100 is a silicon interposer, and the material of the base 100 includes silicon. Silicon is a conventional material in the field of semiconductors, which is beneficial to improve the process compatibility and reduce costs. In addition, a second trench is subsequently formed in the base 100 of the capacitor region II, and a capacitor is formed in the second trench. The capacitor is a silicon capacitor, and the silicon interposer is selected and used, which is further beneficial to improve the compatibility of the formed capacitor and the formed adapter board, thereby implementing the mass production of the adapter board and the capacitor. Specifically, in some implementations, the material of the base 100 is monocrystalline silicon, thereby ensuring that the base 100 can isolate the subsequently formed via interconnect structure from the capacitor.

In some implementations, the base 100 further includes a capacitor region II used for forming a capacitor thereon, which makes preparation for subsequent formation of the capacitor in the base 100 of the capacitor region II.

In some implementations, the capacitor region II and the interconnect region I shown in the figure are adjacent regions. In other implementations, the capacitor region can be alternatively not adjacent to the interconnect region. In other implementations, the capacitor regions can be alternatively adjacently located between the interconnect regions.

Figure 3:
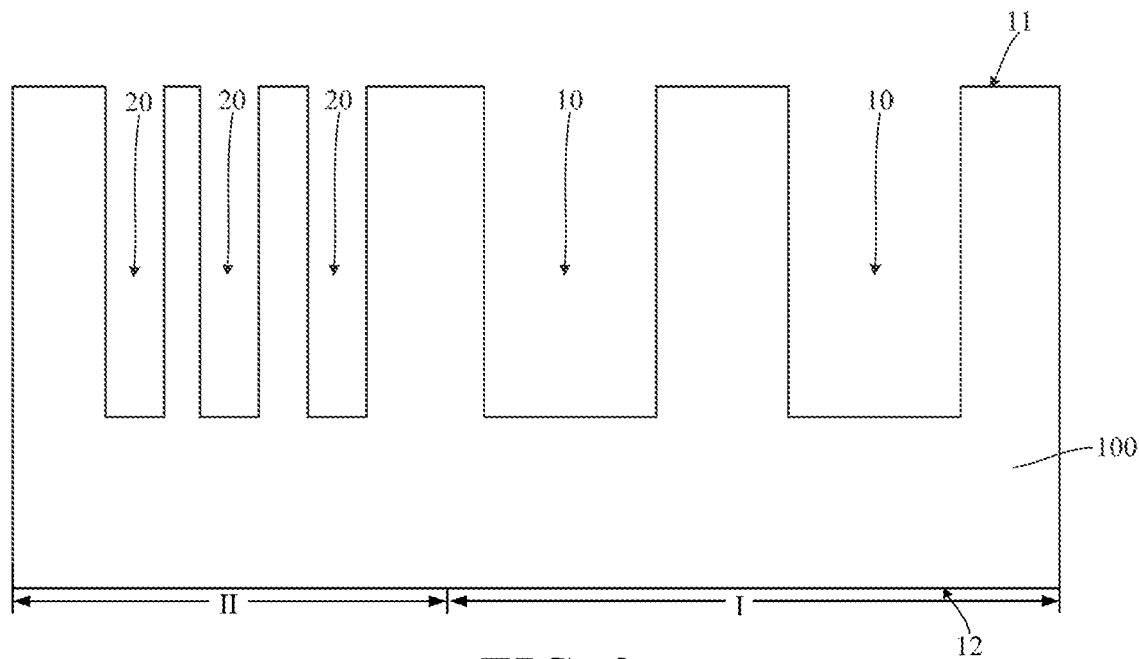

Referring to FIG. 3, the front surface 11 of the base 100 is etched, to form a first trench 10 in the base 100 of the interconnect region I and form a second trench 20 in the base 100 of the capacitor region II.

The first trench 10 is used for making preparation for subsequent formation of a conductive via. The conductive via is used for providing a forming space for a via interconnect structure.

The second trench 20 is used for providing a forming space for subsequent formation of a capacitor.

During the formation of the first trench 10, the second trench 20 is further formed, so that a process of forming the second trench 20 and a process of forming the first trench 10 are integrated, which is beneficial to improve the process integration and the process compatibility. In addition, there is no need to additionally use a mask during the formation of the second trench 20, which is further beneficial to reduce costs.

In some implementations, in the step of forming the first trench 10 and the second trench 20, an opening size of the first trench 10 is greater than an opening size of the second trench 20. A capacitor is subsequently formed in the second trench 20. During the formation of the capacitor, the capacitor is further formed on the bottom and side walls of the first trench 10. Because the opening size of the first trench 10 is greater than the opening size of the second trench 20, after the capacitor is subsequently formed, the first trench 10 still has a remaining space, and after conductive via is subsequently formed by etching the base 100 under the first trench 10, the conductive via can further provide space for forming the via interconnect structure.

In the step of forming the first trench 10, the opening size of the first trench 10 is a first size.

It should be noted that the opening size of the second trench 20 should not be excessively small or excessively large. If the opening size of the second trench 20 is excessively small, a space for subsequent formation of the capacitor tends to be excessively small, and a process difficulty in forming the capacitor in the second trench 20 tends to increase. If the opening size of the second trench 20 is excessively large, because the capacitor needs to fully fill the second trench 20, during the formation of the capacitor, a thickness of the capacitor that needs to be deposited is excessively large. Correspondingly, to ensure that after the conductive via is subsequently formed by etching the base 100 under the first trench 10, the conductive via still has a sufficient space for forming a via interconnect structure, the required opening size of the first trench 10 is also excessively large, which tends to increase areas occupied by the capacitor and the via interconnect structure and reduce the density of capacitors and via interconnect structures per unit area. Therefore, in some implementations, in the step of forming the second trench 20, the opening size of the second trench 20 ranges from 0.2 μm to 3 μm, for example, 0.5 μm to 2 μm or 1 μm to 1.5 μm.

In some implementations, the front surface 11 of the base 100 is etched using an anisotropic dry etching process, to form the first trench 10 and the second trench 20. The anisotropic dry etching process is characterized by anisotropic etching, which is beneficial to improve the controllability of an etching profile, thereby improving the cross-sectional profile quality of the first trench 10 and the second trench 20, for example, improving the smoothness and the perpendicularity of the side walls of the first trench 10 and the second trench 20. In addition, the anisotropic dry etching process has high etching accuracy, which is beneficial to reduce damage to the base 100.

In an example, the anisotropic dry etching process is a reactive-ion etching (RIE) process. During the RIE process, a radio frequency voltage is applied between plate electrodes, and chemical etching and physical etching are performed on a to-be-etched layer using generated plasma. There is a large quantity of chemically active gas ions in the plasma generated by gas discharge. The gas ions interact with the material surface to cause a chemical reaction of surface atoms, to generate a volatile product. The volatile product is exhausted out of a reaction chamber through a vacuum pumping system. As the circulation of a period of "reaction-stripping-discharge" of a material surface layer, the material is etched layer by layer to a designated depth. In addition to the chemical reaction on the surface, when the material surface is bombarded by ions with energy, atoms on the surface also sputter, to achieve a specific etching effect. Therefore, by using the RIE process, it is beneficial to further improve the cross-sectional profile quality of the first trench 10 and the second trench 20, and it is further beneficial to accurately control the depths of the first trench 10 and the second trench 20.

Figure 4:
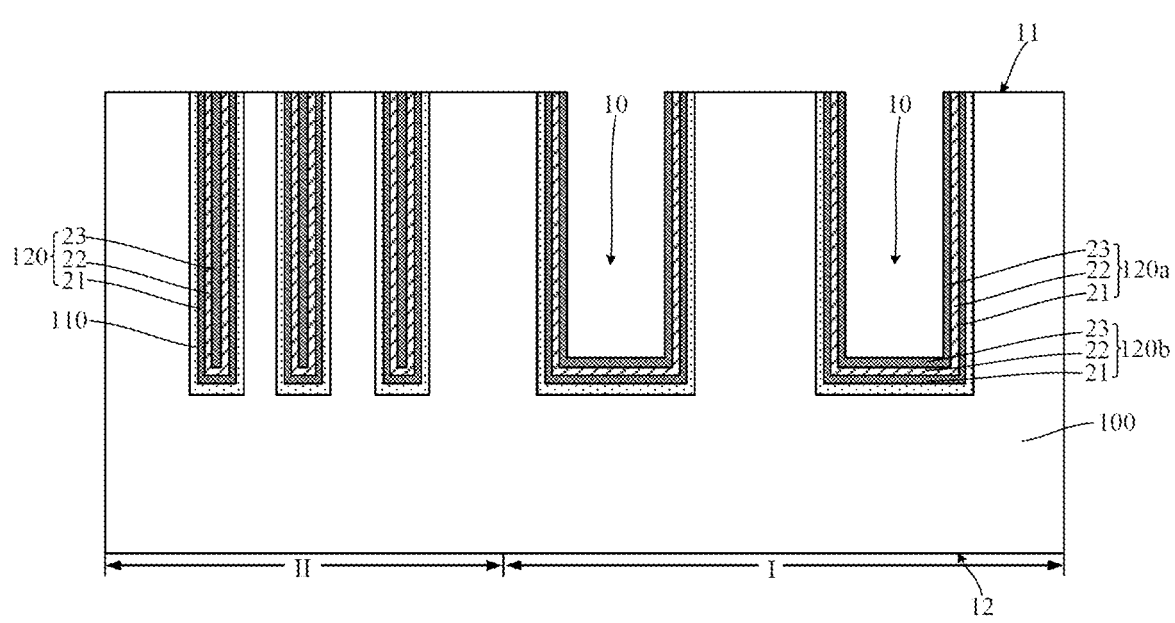

Referring to FIG. 4, after the first trench 10 and the second trench 20 are formed and before the capacitor is formed, the method for forming an adapter board further includes: forming a first insulating layer 110 respectively on the side walls and bottom surface of the first trench 10 and on the side walls and bottom surface of the second trench 20.

The first insulating layer 110 is used for implementing electrical insulation between the capacitor and the base 100.

Therefore, the material of the first insulating layer 110 is an insulating material, for example, at least one of silicon oxide, silicon nitride, or silicon oxynitride. In an example, the material of the first insulating layer 110 is silicon oxide. Silicon oxide is a conventional insulating material in the field of semiconductors, which is beneficial to improve the process compatibility and reduce process costs. In addition, the insulation performance of silicon oxide is relatively adequate, which is beneficial to ensure the insulation performance of the first insulating layer 110 between the capacitor and the base 100. In addition, the adhesion between silicon oxide and another material layer (for example, the material of the base 100 or the material of the subsequent capacitor) is relatively adequate, which is beneficial to improve the subsequent adhesion between the capacitor and the base 100. In addition, the first trench 10 and the second trench 20 are formed using an etching process, and the first insulating layer 110 is respectively located on the side walls and bottom surface of the first trench 10 and on the side walls and bottom surface of the second trench 20, which is beneficial to improve the surface smoothness and flatness of the first trench 10 and the second trench 20, reduces interface defects of the first trench 10 and the second trench 20, and is beneficial to provide an adequate interface for the formation of the capacitor.

In some implementations, the first insulating layer 110 is formed using an atomic layer deposition (ALD) process.

Referring to FIG. 4 again, the capacitor 120 is formed in the second trench 20. The capacitor 120 includes a first electrode 21 located on the side walls and bottom of the second trench 20, a capacitor dielectric layer 22 located on the first electrode 21, and a second electrode 23 located on the capacitor dielectric layer 22. The second electrode 23 fills the second trench 20.

In some implementations, the capacitor 120 is formed in the second trench 20, so that a process of forming the capacitor 120 and a process of forming the adapter board are integrated, and an additional step of forming the capacitor 120 is omitted, which is beneficial to reduce processes and improve the process integration, and is further beneficial to reduce process costs and shorten the production cycle. Moreover, the capacitor 120 is further formed in the adapter board provided in embodiments and implementations of the present disclosure, which is beneficial to improve the functional diversity of the adapter board, so that an application scenario of the adapter board is diversified.

Specifically, in a packaging process, the adapter board provided in some implementations of the present disclosure is bonded to a circuit board, and a chip is bonded to the adapter board, to electrically connect the chip to the capacitors 120. The capacitor 120 is electrically connected to the chip, and is used as a bypass capacitor or a decoupling capacitor, thereby achieving the function of preventing interference.

Specifically, the bypass capacitor uses high-frequency noise in an input signal as a filtering object, and filters out the high-frequency noise carried by a preamplifier, thereby eliminating self-excitation, to enable an amplifier to work stably. The decoupling capacitor uses interference of an output signal as a filtering object, to reduce a probability of a decrease in the voltage due to an abrupt change in current, thereby satisfying a change in current of a drive circuit and reducing mutual coupling interference.

In some implementations, the capacitor 120 is formed in the second trench 20. The capacitor 120 has a three-dimensional structure, which is beneficial to increase the surface area of the capacitor 120 without increasing an occupied area of the capacitor 120, thereby improving the density of the capacitors 120 and the electrostatic capacity of the capacitor 120 per unit area.

In an example, the capacitor 120 is a silicon capacitor. The silicon capacitor has advantages such as a low insertion loss and high stability, and the material of an electrode of the silicon capacitor includes silicon. Silicon is a conventional and readily available material in a semiconductor process. Therefore, it is beneficial to improve the process compatibility and reduce process costs.

The material of the first electrode 21 and the second electrode 23 is a conductive material. In an example, the capacitor 120 is a silicon capacitor, and the material of the first electrode 21 and the second electrode 23 includes polysilicon doped with conductive ions.

The conductive ion includes an n-type ion (for example, a P ion, an As ion or an Sb ion) or a P-type ion (for example, the p-type ion may be a B ion, a Ga ion or an In ion).

The capacitor dielectric layer 22 is used for electrically isolating the first electrode 21 from the second electrode 23. The material of the capacitor dielectric layer 22 is an insulating material. In one example, the material of the capacitor dielectric layer 22 is the same as that of the first insulating layer 110, and the material of the capacitor dielectric layer 22 is silicon oxide, which is beneficial to improve the process compatibility.

A process of forming the capacitor 120 includes one or more of an ALD process, a chemical vapor deposition process, and a physical vapor deposition process.

In some implementations, the first electrode 21, the capacitor dielectric layer 22, and the second electrode 23 are sequentially formed by using the ALD process.

In some implementations, the first electrode 21, the capacitor dielectric layer 22, and the second electrode 23 are sequentially formed on the bottom and side surfaces of the second trench 20. During the formation of the second electrode 23, the side walls of the second electrode 23 located in the second trench 20 are in contact with each other, so that the capacitor 120 fills the second trench 20.

In some implementations, in the step of forming the capacitor 120, the capacitor 120 is further formed on the side walls and bottom surface of the first trench 10. A portion, located on the side walls of the first trench 10, of the capacitor 120 is used as a side portion 120a of the capacitor, and a portion, located on the bottom surface of the first trench 10, of the capacitor 120 is used as a bottom 120b of the capacitor.

It should be noted that, in the step of forming the capacitor 120, a thickness of the side portion 120a of the capacitor in a direction perpendicular to the side wall of the first trench 10 is a second size. Compared with the first size, the second size should not be excessively small or excessively large. Because the capacitor 120 needs to fill the second trench 20, the thickness of the side portion 120a of the capacitor is not excessively small. That is, the second size is not excessively small. In addition, to ensure that in the step of subsequently etching the base 100 under the first trench 10 to form the conductive via after the capacitor 120 is formed, the conductive via still has a sufficient space to be used for forming a via interconnect structure, thereby ensuring that the resistance of the via interconnect structure is not excessively large, and further ensuring electrical connection performance of the via interconnect structure, and the second size should not be excessively large. Therefore, in some implementations, the second size ranges from 10% to 30% of the first size.

Figure 5:
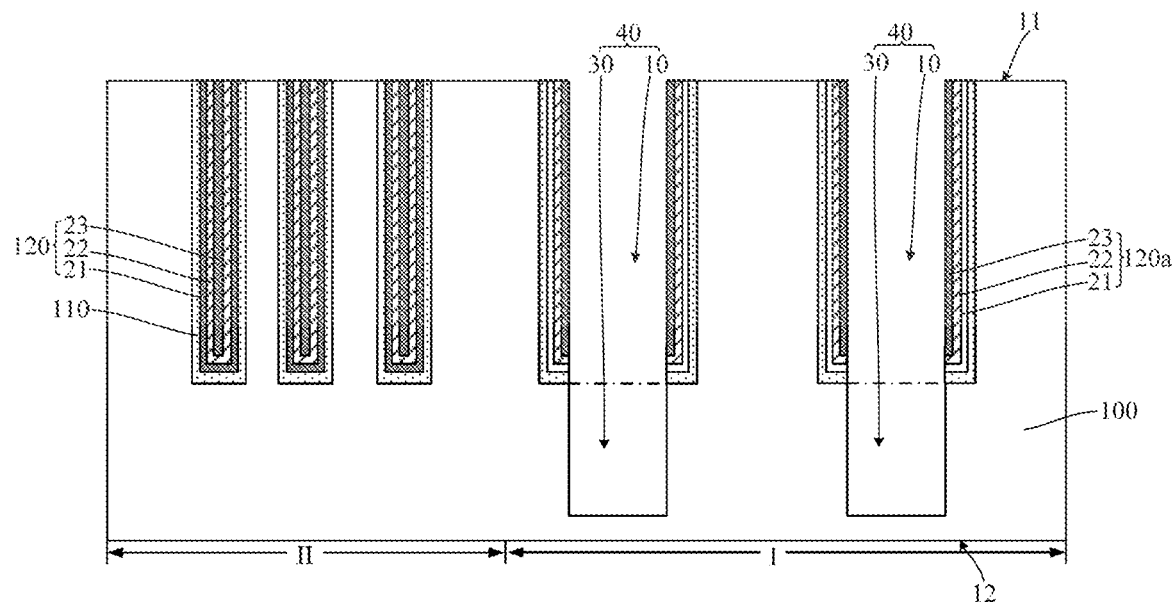

Referring to FIG. 5, a partial thickness of the base 100 under the first trench 10 is etched after the capacitor 120 is formed, to form a groove 30 in the base 100. The groove 30 and the first trench 10 form a conductive via 40.

The conductive via 40 is used for providing a forming space for the formation of the via interconnect structure.

In some implementations, the conductive via 40 is a TSV.

In some implementations, the step of forming the conductive via 40 includes: removing the bottom 120b of the capacitor exposed from the side portion 120a of the capacitor, to expose a partial bottom surface of the first trench 10; and etching a partial thickness of the base 100 that is under the first trench 10 and is exposed from the side portion 120a of the capacitor, to form the groove 30.

Therefore, the conductive via 40 is surrounded by the groove 30 and the side portion 120a of the capacitor.

A process of etching the partial thickness of the base 100 under the first trench 10 includes an anisotropic dry etching process. In some implementations, the partial thickness of the base 100 under the first trench 10 is etched using an RIE process, which is beneficial to improve the cross-sectional profile quality of the groove 30, and further improve the cross-sectional profile quality of the conductive via 40.

Figure 6:
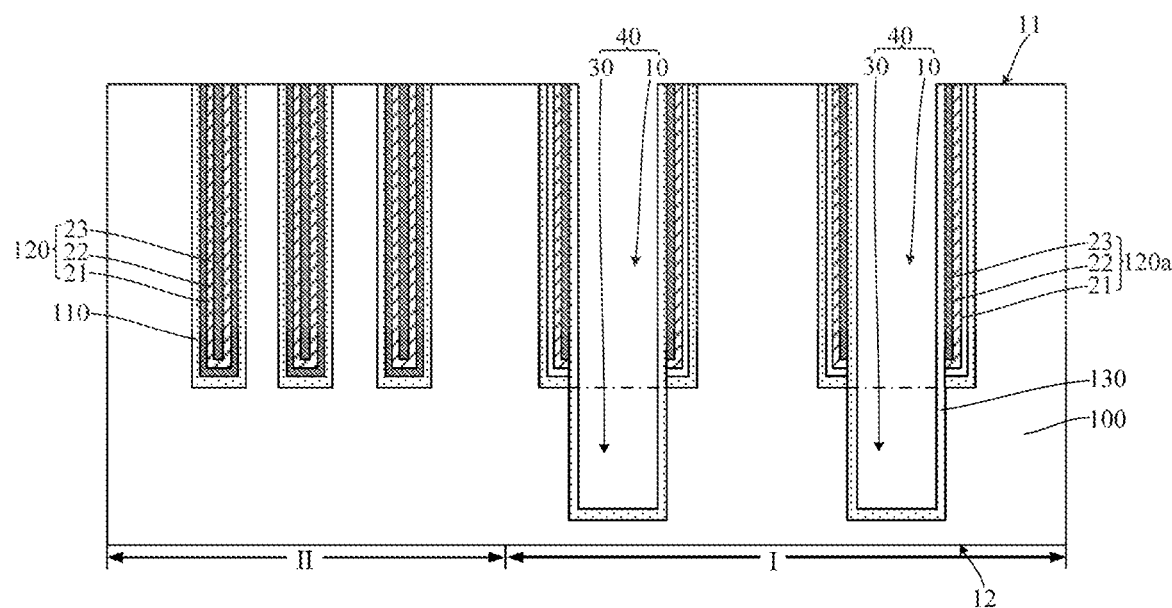

Referring to FIG. 6, after the conductive via 40 is formed and before the via interconnect structure is formed, the method for forming an adapter board further includes: forming a second insulating layer 130 on the bottom surface and side walls of the conductive via 40.

A via interconnect structure is subsequently formed in the conductive via 40. The second insulating layer 130 is used for electrically isolating the base 100 from the via interconnect structure and electrically isolating the capacitor 120 from the via interconnect structure, thereby reducing the impact of the capacitor 120 formed in the first trench 10 on the via interconnect structure.

The material of the second insulating layer 130 is an insulating material. In some implementations, the material of the second insulating layer 130 is silicon oxide.

In some implementations, a process of forming the second insulating layer 130 includes an ALD process.

Figure 7:
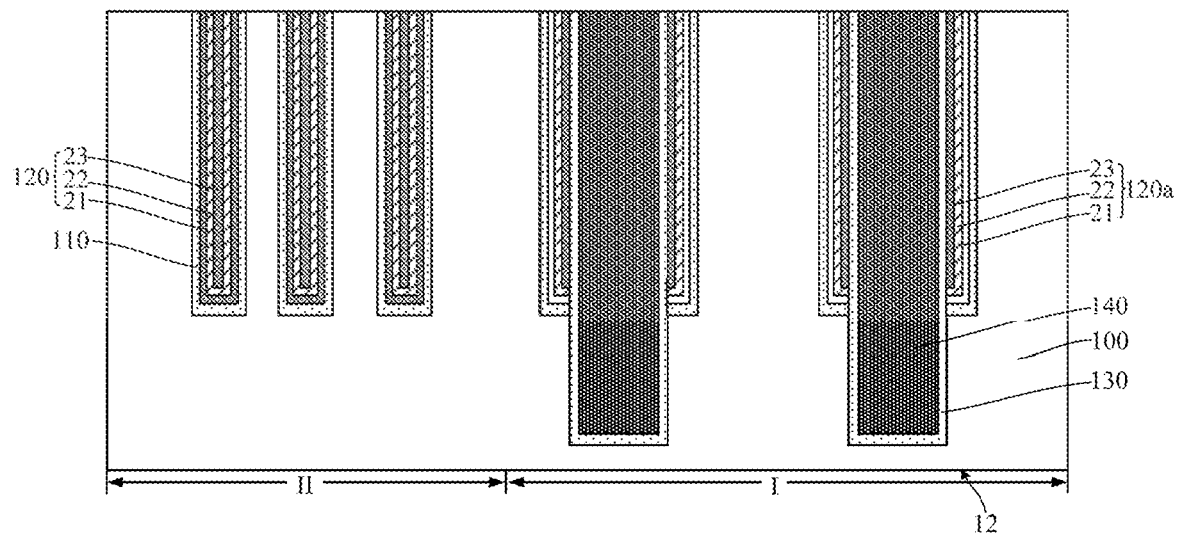

Referring to FIG. 7, the via interconnect structure 140 is formed in the conductive via 40.

Thinning is subsequently performed on the rear surface 12 of the base 100, to expose the via interconnect structure 140.

After the adapter board is formed, the adapter board is bonded to the circuit board, and the chip is bonded to the adapter board, the via interconnect structure 140 being used for implementing electrical connection between the chip and the circuit board. Alternatively, when the adapter board is bonded between chips, the via interconnect structure 140 is further used for implementing electrical connection between the chips.

In some implementations, the via interconnect structure 140 is a TSV interconnect structure. The TSV interconnect structure can implement vertical conduction between the circuit board and the chip and between chips, and can maximize the density of stacking in a three-dimensional direction and reduce a horizontal area of a 3D IC. In addition, the TSV interconnect structure has features of a short connection distance and high strength, which can implement a thinner and smaller package that has better performance and a significantly reduced size and weight, and is beneficial to reduce power consumption and improve the execution speed.

In some implementations, the via interconnect structure 140 includes: a barrier layer (not shown in the figure) located on the bottom surface and side walls of the conductive via 40 and a conductive layer (not shown in the figure) located on the barrier layer and filling the conductive via 40.

The barrier layer is used for reducing a probability of the material of the conductive layer diffusing into the second insulating layer 130, thereby improving the reliability of the via interconnect structure 140.

In some implementations, a metal material with relatively high chemical stability is selected as the material of the barrier layer, for example, one or more of Ti, Ta, TiN, and TaN.

In some implementations, the material of the conductive layer is a material with relatively high conductive performance, for example, a metal material such as copper, tungsten, cobalt or nickel.

Figure 8:
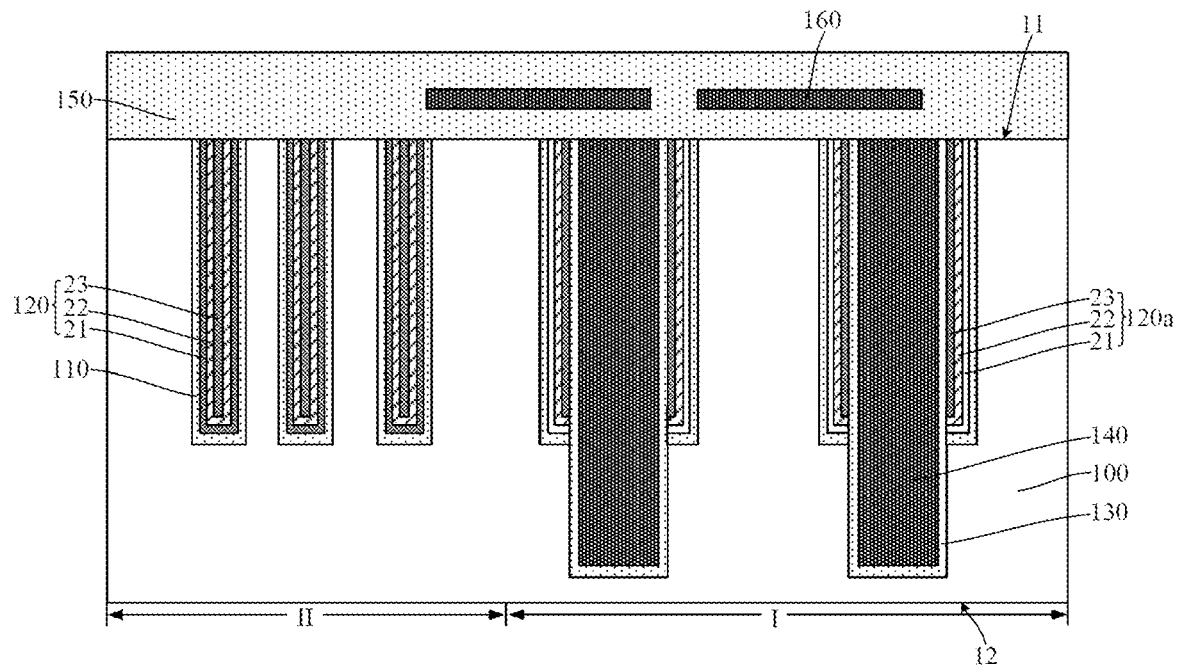
Figure 9:
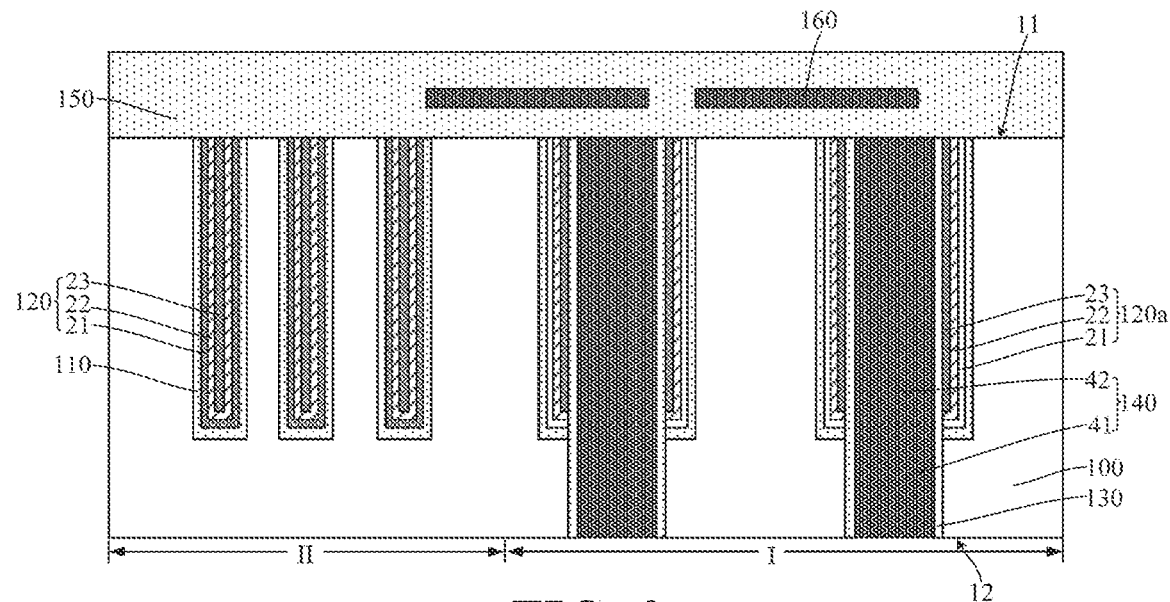

Referring to FIG. 8 and FIG. 9, the rear surface 12 of the base 100 is thinned, to expose the via interconnect structure 140 from the rear surface 12 of the base 100.

The via interconnect structure 140 is exposed from the rear surface 12 of the base 100 through thinning, to enable the via interconnect structure 140 to run through the base 100 of the interconnect region I, to make preparation for the via interconnect structure 140 to subsequently implement vertical interconnection between the circuit board and the chip or between chips.

In some implementations, thinning is performed on the rear surface 12 of the base 100 by using a chemical mechanical polishing (CMP) process.

In some implementations, after thinning is performed on the rear surface 12 of the base 100, a depth of the capacitor 120 in a direction perpendicular to the surface of the base 100 accounts for 30% to 60% of the thickness of the base 100.

The via interconnect structure 140 includes a first portion 41 close to the rear surface 12 of the base 100 and a second portion 42 that is close to the front surface 11 of the base 100 and is connected to the first portion 41.

It should be noted that, referring to FIG. 8, in some implementations, after the via interconnect structure 140 is formed and before thinning is performed on the rear surface 12 of the base 100, the method for forming an adapter board further includes: forming a first dielectric layer 150 on the front surface 11 of the base 100, and forming a first interconnect structure 160 in the first dielectric layer 150, the first interconnect structure 160 being electrically connected to the capacitor 120, the first interconnect structure 160 being electrically connected to the via interconnect structure 140.

The first dielectric layer 150 is used for electrically isolating the first interconnect structures 160.

The first interconnect structure 160 is used for implementing electrical connection between the via interconnect structure 140 and another interconnect structure, a chip, a circuit board or a component. Specifically, the first interconnect structure 160 may be a redistribution Layer (RDL).

In an actual process, the method for forming an adapter board can further include: after thinning is performed, forming a second dielectric layer (not shown in the figure) on the rear surface 12 of the base 100, and forming a second interconnect structure (not shown in the figure) in the second dielectric layer, the second interconnect structure being electrically connected to the capacitor 120, the second interconnect structure being electrically connected to the via interconnect structure 140.

The second dielectric layer is used for electrically isolating the second interconnect structures.

The second interconnect structure is used for implementing electrical connection between the via interconnect structure 140 and another interconnect structure, a chip, a circuit board or a component.

It should be noted that, in an actual process, a bump can further be formed on the first interconnect structure 160 and the second interconnect structure. The bump is used for implementing electrical connection between the first interconnect structure 160 and an external circuit, a chip, a circuit board or another component or between the second interconnect structure and an external circuit, a chip, a circuit board or another component.

Figure 10:
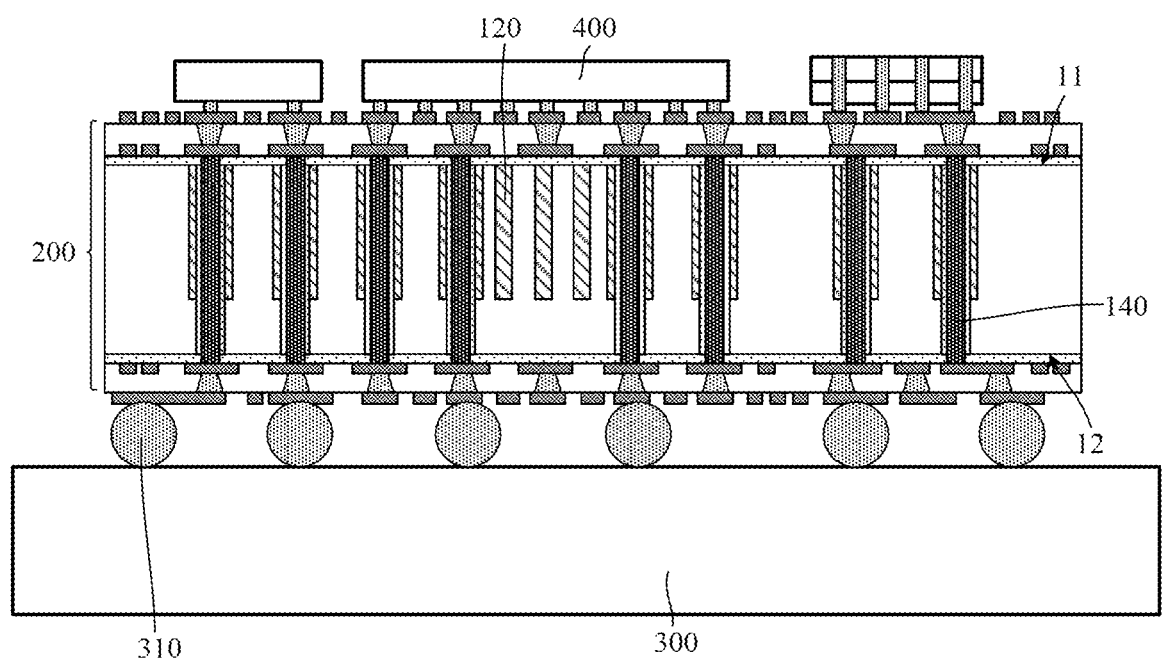
FIG. 10 is a schematic structural diagram corresponding to steps in one form of a packaging method according to the present disclosure.

Correspondingly, the present disclosure further provides a packaging method. FIG. 10 is a schematic structural diagram corresponding to steps in an embodiment of a packaging method according to the present disclosure.

Referring to FIG. 10, a circuit board 300 is provided.

The circuit board 300 is used for connecting various parts and components to form a predetermined circuit, thereby achieving the function of relay transmission.

Specifically, the circuit board 300 is short for a PCB. The PCB is formed by using electronic printing. The PCB is a substrate used for assembling electronic parts thereon, and is a printed board forming connection between points and a printed element on a common base material according to a preset design.

Referring to FIG. 10 again, an adapter board 200 is bonded to the circuit board 300, to electrically connect the via interconnect structure 140 to the circuit board 300. The rear surface 12 of the base 100 is arranged opposite the circuit board 300.

The adapter board 200 is bonded to the circuit board 300, so that after a chip is bonded to the adapter board 200, the adapter board 200 can implement electrical connection between the chip and the circuit board 300.

In some implementations, the adapter board 200 is bonded to the circuit board 300 by a solder ball 310. The solder ball 310 is electrically connected to the via interconnect structure 140 by the second interconnect structure.

The material of the solder ball 310 includes an alloy such as Sn/Pb, Sn/In or Sn/Cu/Ag.

Referring to FIG. 10 again, a chip 400 is provided.

The chip 400 is used as a to-be-integrated chip in a packaging process, and is used for being subsequently bonded to the adapter board 200, to implement electrical connection between the chip 400 and the circuit board by the adapter board 200. The chip 400 may be one or more of elements with different functions, for example, an active element, a passive element, a micro-electro-mechanical system, and an optical element. Specifically, the chip 400 may be a storage chip, a communication chip, a processor or a logical chip.

In an example, the chip 400 is a processor, for example, a chip such as a CPU that can output a high-frequency signal.

When the distance between the capacitor 120 and the CPU is shorter, it indicates that the power consumption caused by a high-frequency circuit is lower.

Referring to FIG. 10 again, the chip 400 is bonded to the adapter board 200 formed using one form of a method for forming an adapter board as described in the present disclosure, to electrically connect the chip 400 to the capacitor 120 and electrically connect the chip 400 to the via interconnect structure 140. The chip 400 is located on the front surface 11 of the base 100.

In some implementations, the adapter board 200 formed using one form of a method for forming an adapter board as described in the present disclosure is bonded to the circuit board 300, to electrically connect the via interconnect structure 140 to the circuit board 300, bond the chip 400 to the adapter board 200, electrically connect the chip 400 to the capacitor 120, and electrically connect the chip 400 to the via interconnect structure 140. The front surface of the base 100 is arranged opposite the chip 400, and the rear surface of the base 100 is arranged opposite the circuit board 300. Compared with a solution in which the capacitor is bonded to the circuit board and the capacitor is located between the adapter board and the circuit board, in a solution in which the capacitor 120 is formed in the adapter board 200 in this implementation of the present disclosure, an additional process of forming the capacitor 120 is omitted, and the distance between the capacitor 120 and the chip 400 is shorter, which is beneficial to improve RC delay of a device and increase a signal transmission rate, and further improve the performance of the device.

Particularly, in some implementations, the chip 400 is a CPU, and the distance between the capacitor 120 and the chip 400 is shortened, which is beneficial to significantly improve the performance of the device.

It should be noted that, in an actual process, a sequence between bonding the adapter board 200 to the circuit board 300 and bonding the chip 400 to the adapter board 200 is decided according to an actual process requirement. A sequence between bonding the adapter board 200 to the circuit board 300 and bonding the chip 400 to the adapter board 200 is not limited in the embodiments and implementations of the present disclosure.

The present disclosure further provides an adapter board. FIG. 9 is a schematic structural diagram of one form of an adapter board according to the present disclosure.

The adapter board includes: a base 100, including an interconnect region I used for forming a via interconnect structure thereon and a capacitor region II used for forming a capacitor thereon, the base 100 including a front surface 11 and a rear surface 12 that are opposite each other; capacitors 120, located in a partial thickness of the base 100 of the capacitor region II, the capacitor 120 including a first electrode 21 in contact with the base 100, a capacitor dielectric layer 22 located on the first electrode 21, and a second electrode 23 located on the capacitor dielectric layer 22, the side walls of the second electrode 23 being in contact with each other, the top surface of the capacitor 120 being opposite the rear surface 12 of the base 100; and a via interconnect structure 140, running through the base 100 of the interconnect region I.

In some implementations, the capacitor 120 is further formed in the adapter board, so that a process of forming the capacitor 120 and a process of forming the adapter board are integrated, and an additional step of forming the capacitor 120 is omitted, which is beneficial to reduce processes and improve the process integration, and is further beneficial to reduce process costs and shorten the production cycle. Moreover, the capacitor 120 is further formed in the adapter board provided in this implementation of the present disclosure, which is beneficial to improve the functional diversity of the adapter board, so that an application scenario of the adapter board is diversified.

The base 100 is used for providing a platform for processes. In some implementations, the base 100 is used as an interposer and is used for isolating the via interconnect structure 140 from the capacitor 120.

In some implementations, the base 100 is a silicon interposer, and the material of the base 100 includes silicon. Silicon is a conventional material in the field of semiconductors, which is beneficial to improve the process compatibility and reduce costs. In addition, the capacitor 120 is a silicon capacitor, and the silicon interposer is selected and used, which is further beneficial to improve the compatibility of the formed capacitor 120 and the formed adapter board, thereby implementing the mass production of the adapter board and the capacitor. In some implementations, the material of the base 100 is monocrystalline silicon, thereby ensuring that the base 100 can electrically isolate the via interconnect structure 140 from the capacitor 120.

In some implementations, the capacitor region II and the interconnect region I shown in the figure are adjacent regions. In other implementations, the capacitor region can be alternatively not adjacent to the interconnect region. In other implementations, the capacitor regions can be alternatively adjacently located between the interconnect regions.

Specifically, in a packaging process, the adapter board provided in this embodiment of the present disclosure is bonded to a circuit board, and a chip is bonded to the adapter board, to electrically connect the chip to the capacitors 120. The capacitor 120 is electrically connected to the chip, and is used as a bypass capacitor or a decoupling capacitor, thereby achieving the function of preventing interference.

Specifically, the bypass capacitor uses high-frequency noise in an input signal as a filtering object, and filters out the high-frequency noise carried by a preamplifier, thereby eliminating self excitation, to enable an amplifier to work stably. The decoupling capacitor uses interference of an outputted signal as a filtering object, to reduce a probability of a decrease in the voltage due to an abrupt change in current, thereby satisfying a change in current of a drive circuit and reducing mutual coupling interference.

In some implementations, the second trench is formed in the base 100 of the capacitor region I, and the capacitor 120 is formed in the second trench. The capacitor 120 has a three-dimensional structure, which is beneficial to increase the surface area of the capacitor 120 without increasing an occupied area of the capacitor 120, thereby improving the density of the capacitors 120 and the electrostatic capacity of the capacitor 120 per unit area.

In an example, the capacitor 120 is a silicon capacitor. The silicon capacitor has advantages such as a low insertion loss and high stability, and the material of an electrode of the silicon capacitor includes silicon. Silicon is a conventional and readily available material in a semiconductor process. Therefore, it is beneficial to improve the process compatibility and reduce process costs.

The material of the first electrode 1 and the second electrode 23 is a conductive material. In an example, the capacitor 120 is a silicon capacitor, and the material of the first electrode 21 and the second electrode 23 includes polysilicon doped with conductive ions.

The capacitor dielectric layer 22 is used for electrically isolating the first electrode 21 from the second electrode 23. The material of the capacitor dielectric layer 22 is an insulating material. In an example, the material of the capacitor dielectric layer 22 is silicon oxide, which is beneficial to improve the process compatibility.

It should be noted that, a width of the capacitor 120 in a direction parallel to the surface of the base 100 should not be excessively small or excessively large. If the width of the capacitor 120 is excessively small, because the capacitor 120 is formed in the second trench, an opening size of the second trench is correspondingly excessively small, which easily increases a difficulty in forming the capacitor 120, and reduces the forming quality of the capacitor 120. If the width of the capacitor 120 is excessively large, an area occupied by the capacitor 120 in the direction parallel to the surface of the base 100 tends to be excessively large, which is not beneficial to increase the density of capacitors 120. Therefore, in some implementations, the width of the capacitor 120 in the direction parallel to the surface of the base 100 ranges from 0.2 µm to 3 µm, for example, 0.5 µm to 2 µm or 1 µm to 1.5 µm.

It should further be noted that, in a direction perpendicular to the surface of the base 100, a percentage of a depth of the capacitor 120 in the thickness of the base 100 should not be excessively small or excessively large. If the percentage of the depth of the capacitor 120 in the thickness of the base 100 is excessively small, it is not beneficial to increase the surface area of the capacitor 120 and the electrostatic capacity of the capacitor 120 per unit area. If the percentage of the depth of the capacitor 120 in the thickness of the base 100 is excessively large, the depth of the capacitor 120 tends to be excessively large. The capacitor 120 is a long-strip-shaped structure, and because a process of thinning the rear surface of the base 100 is included in a formation process of the adapter board, an excessively large depth of the capacitor 120 is prone to a relatively high risk of a problem such as fragmentation or delamination of the capacitor 120. Therefore, in some implementations, the depth of the capacitor 120 in a direction perpendicular to the surface of the base 100 accounts for 30% to 60% of the thickness of the base 100.

The via interconnect structure 140 includes a first portion 41 close to the rear surface 12 of the base 100, and a second portion 42 that is close to the front surface 11 of the base 100 and is connected to the first portion 41. The capacitor 120 is further located between the side wall of the second portion 42 and the base 100.

During the formation of the adapter board, the first trench is formed in the base 100 of the interconnect region I, and during the formation of the capacitor 120, the capacitor 120 is further formed in the first trench. The via interconnect structure 140 is formed after the formation of the capacitor 120, so that the via interconnect structure 140 is correspondingly formed in the first trench having the capacitor 120. Therefore, the capacitor 120 is further located between the side wall of the second portion 42 and the base 100. Specifically, the capacitor 120 located between the side wall of the second portion 42 and the base 100 is a side portion 120a of the capacitor.

The adapter board further includes: a first insulating layer 110, located between the capacitor 120 and the base 100.

The first insulating layer 110 is used for implementing electrical insulation between the capacitor 120 and the base 100.

Therefore, the material of the first insulating layer 110 is an insulating material, for example, at least one of silicon oxide, silicon nitride, or silicon oxynitride. In an example, the material of the first insulating layer 110 is silicon oxide. Silicon oxide is a conventional insulating material in the field of semiconductors, which is beneficial to improve the process compatibility and reduce process costs. In addition, the insulation performance of silicon oxide is relatively adequate, which is beneficial to ensure the insulation performance of the first insulating layer 110 between the capacitor 120 and the base 100. In addition, the adhesion between silicon oxide and another material layer (for example, the material of the base 100 or the material of the capacitor 120) is relatively adequate, which is beneficial to improve the adhesion between the capacitor 120 and the base 100 and the interface performance between the capacitor 120 and the base 100.

In the packaging process, the adapter board is bonded to the circuit board, the chip is bonded to the adapter board, and the via interconnect structure 140 is used for implementing electrical connection between the chip and the circuit board. Alternatively, when the adapter board is bonded between chips, the via interconnect structure 140 is further used for implementing electrical connection between the chips.

In some implementations, the via interconnect structure 140 is a TSV interconnect structure. The TSV interconnect structure can implement vertical conduction between the circuit board and the chip and between chips, and can maximize the density of stacking in a three-dimensional direction and reduce a horizontal area of a 3D IC. In addition, the TSV interconnect structure has features of a short connection distance and high strength, which can implement a thinner and smaller package that has better performance and a significantly reduced size and weight, and is beneficial to reduce power consumption and improve the execution speed.

In some implementations, the via interconnect structure 140 includes: a conductive layer (not shown in the figure) running through the base 100 of the interconnect region I and a barrier layer (not shown in the figure) located on side walls of the conductive layer.

In some implementations, the material of the conductive layer is a material with relatively high conductive performance, for example, a metal material such as copper, tungsten, cobalt or nickel.

The barrier layer is used for reducing a probability of the material of the conductive layer diffusing into the second insulating layer 130, thereby improving the reliability of the via interconnect structure 140.

In some implementations, a metal material with relatively high chemical stability is selected as the material of the barrier layer, for example, at least one of Ti, Ta, TiN, or TaN.

The adapter board further includes: a second insulating layer 130, located between the capacitor 120 and the via interconnect structure 140 and between the via interconnect structure 140 and the base 100.

The second insulating layer 130 is used for electrically isolating the base 100 from the via interconnect structure 140 and electrically isolating the capacitor 120 from the via interconnect structure 140, thereby reducing the impact of the capacitor 120 located between the side wall of the second portion and the base 100 on the via interconnect structure 140.

The material of the second insulating layer 130 is an insulating material. In some implementations, the material of the second insulating layer 130 is silicon oxide.

In some implementations, the adapter board further includes: a first dielectric layer 150 located on the front surface 11 of the base 100; and a first interconnect structure 160, located in the first dielectric layer 150, the first interconnect structure 160 being electrically connected to the capacitor 120, the first interconnect structure 160 being electrically connected to the via interconnect structure 140.

The first dielectric layer 150 is used for electrically isolating the first interconnect structures 160.

The first interconnect structure 160 is used for implementing electrical connection between the via interconnect structure 140 and another interconnect structure, a chip, a circuit board or a component.

Specifically, the first interconnect structure 160 may be an RDL.

In an actual process, the adapter board can further include: a second dielectric layer (not shown in the figure), located on the rear surface 12 of the base 100; and A second interconnect structure (not shown in the figure), located in the second dielectric layer, the second interconnect structure being electrically connected to the capacitor 120, the second interconnect structure being further electrically connected to the via interconnect structure 140.

The second dielectric layer is used for electrically isolating the second interconnect structures.

The second interconnect structure is used for implementing electrical connection between the via interconnect structure 140 and another interconnect structure, a chip, a circuit board or a component.

It should be noted that, in an actual process, a bump can further be formed on the first interconnect structure 160 and the second interconnect structure. The bump is used for implementing electrical connection between the first interconnect structure 160 and an external circuit, a chip, a circuit board or another component or between the second interconnect structure and an external circuit, a chip, a circuit board or another component.

The adapter board may be formed using the forming method described in the foregoing embodiments and implementations or may be formed using another forming method. For specific descriptions of the adapter board, reference may be made to corresponding descriptions in the foregoing embodiments and implementations, as details are not described herein again in this implementation.

The present disclosure further provides a package structure. FIG. 10 is a schematic structural diagram of one form of a package structure according to the present disclosure.

The package structure includes: a circuit board 300; the adapter board 200 provided in the present disclosure, bonded to the circuit board 300, to electrically connect the via interconnect structure 140 to the circuit board 300, the rear surface 12 of the base 100 being arranged opposite the circuit board 300; and a chip 400, bonded to the adapter board 200, to electrically connect the chip 400 to the capacitor 120 and electrically connect the chip 400 to the via interconnect structure 140, the chip 400 being located on the front surface 11 of the base 100.

The adapter board 200 provided in embodiments and implementations of the present disclosure is bonded to the circuit board 300, to electrically connect the via interconnect structure 140 to the circuit board 300, bond the chip 400 to the adapter board 200, electrically connect the chip 400 to the capacitor 120, and electrically connect the chip 400 to the via interconnect structure 140. The front surface of the base 100 is arranged opposite the chip 400, and the rear surface of the base 100 is arranged opposite the circuit board 300. Compared with a solution in which the capacitor is bonded to the circuit board and the capacitor is located between the adapter board and the circuit board, in a solution in which the capacitor 120 is formed in the adapter board 200 in this embodiment of the present disclosure, an additional process of forming the capacitor 120 is omitted, and the distance between the capacitor 120 and the chip 400 is shorter, which is beneficial to improve RC delay of a device and increase a signal transmission rate, and further improve the performance of the device.

The circuit board 300 is used for connecting various parts and components to form a predetermined circuit, thereby achieving the function of relay transmission.

Specifically, the circuit board 300 is short for a PCB. The PCB is formed by using electronic printing. The PCB is a substrate used for assembling electronic parts thereon, and is a printed board forming connection between points and a printed element on a common base material according to a preset design.

In some implementations, the adapter board 200 is bonded to the circuit board 300 by a solder ball 310. The solder ball 310 is electrically connected to the via interconnect structure 140 by the second interconnect structure.

The material of the solder ball 310 includes an alloy such as Sn/Pb, Sn/In or Sn/Cu/Ag.

The chip 400 is used as a to-be-integrated chip in a packaging process, and is used for being subsequently bonded to the adapter board 200, to implement electrical connection between the chip 400 and the circuit board by the adapter board 200. The chip 400 may be one or more of elements with different functions, for example, an active element, a passive element, a micro-electro-mechanical system, and an optical element. Specifically, the chip 400 may be a storage chip, a communication chip, a processor or a logical chip.

In an example, the chip 400 is a chip such as a CPU that can output a high-frequency signal. The capacitor 120 is electrically connected to the chip 400, and is used as a bypass capacitor or a decoupling capacitor, thereby achieving the function of preventing interference. When the distance between the capacitor 120 and the CPU is shorter, it indicates that the power consumption caused by a high-frequency circuit is lower. Therefore, the distance between the capacitor 120 and the chip 400 is shortened, which is beneficial to significantly improve the performance of the device.

The package structure may be formed using a packaging method described in the foregoing embodiments and implementations, or may be formed using other methods. For specific descriptions of the package structure, reference may be made to the corresponding descriptions in the foregoing embodiments and implementations, as details are not described herein again in this embodiment.

Although the present disclosure is disclosed above, the present disclosure is not limited thereto. A person skilled in the art may make various modifications and variations without departing from the spirit and scope of the present disclosure. Therefore, the protection scope of the present disclosure should be subject to the scope defined by the claims.

What is claimed is:

1. A method for forming an adapter board, comprising:
   providing a base comprising:
      an interconnect region used for forming a via interconnect structure thereon and a capacitor region used for forming a capacitor thereon, and
      a front surface and a rear surface that are opposite each other;
   etching the front surface of the base to form a first trench in the base of the interconnect region and to form a second trench in the base of the capacitor region;
   forming a capacitor in the second trench, the capacitor comprising a first electrode located on side walls and a bottom of the second trench, a capacitor dielectric layer located on the first electrode, and a second electrode located on the capacitor dielectric layer, the second electrode filling the second trench;
   etching a partial thickness of the base under the first trench after the capacitor is formed, to form a groove in the base, the groove and the first trench forming a conductive via;
   forming a via interconnect structure in the conductive via; and
   thinning the rear surface of the base, to expose the via interconnect structure from the rear surface of the base.

2. The method for forming an adapter board according to claim 1, wherein in the step of forming the first trench and the second trench, an opening size of the first trench is greater than an opening size of the second trench.

3. The method for forming an adapter board according to claim 2, wherein in the step of forming the capacitor, the capacitor is further formed on side walls and a bottom surface of the first trench, where a portion, located on the side wall of the first trench, of the capacitor is used as a side portion of the capacitor, and a portion, located on the bottom surface of the first trench, of the capacitor is used as the bottom of the capacitor; and
   the step of forming the groove comprises:
      removing a bottom of the capacitor exposed from the side portion of the capacitor, to expose a partial bottom surface of the first trench; and
      etching the partial thickness of the base that is under the first trench and is exposed from the side portion of the capacitor, to form the groove.

4. The method for forming an adapter board according to claim 3, wherein:
   in the step of forming the first trench, the opening size of the first trench is a first size; and
   in the step of forming the capacitor, a thickness of the side portion of the capacitor in a direction perpendicular to the side wall of the first trench is a second size, the second size ranging from 10% to 30% of the first size.

5. The method for forming an adapter board according to claim 1, wherein after the first trench and the second trench are formed and before the capacitor is formed, the method for forming an adapter board further comprises: forming a first insulating layer respectively on side walls and a bottom surface of the first trench and on the side walls and bottom surface of the second trench.

6. The method for forming an adapter board according to claim 1, wherein after the conductive via is formed and before the via interconnect structure is formed, the method for forming an adapter board further comprises: forming a second insulating layer on a bottom surface and side walls of the conductive via.

7. The method for forming an adapter board according to claim 1, wherein the front surface of the base is etched using an anisotropic dry etching process, to form the first trench and the second trench.

8. The method for forming an adapter board according to claim 1, wherein the material of the first electrode and the second electrode comprises polysilicon doped with conductive ions.

9. The method for forming an adapter board according to claim 1, wherein a process of forming the capacitor comprises at least one of an atomic layer deposition (ALD) process, a chemical vapor deposition process, or a physical vapor deposition process.

10. The method for forming an adapter board according to claim 1, wherein the partial thickness of the base under the first trench is etched using an anisotropic dry etching process.

11. A packaging method, comprising:
   providing a circuit board;
   bonding the adapter board formed using the method of claim 1 to the circuit board, to electrically connect the via interconnect structure to the circuit board, the rear surface of the base being arranged opposite the circuit board;
   providing a chip; and
   bonding the chip to the adapter board formed using the method according to claim 1, to electrically connect the chip to the capacitor and to electrically connect the chip to the via interconnect structure, the chip being located on the front surface of the base.

12. A package structure, comprising:
   a circuit board;
   the adapter board according to claim 1, bonded to the circuit board, to electrically connect the via interconnect structure to the circuit board, the rear surface of the base being arranged opposite the circuit board; and
   a chip, bonded to the adapter board, to electrically connect the chip to the capacitor and to electrically connect the chip to the via interconnect structure, the chip being located on the front surface of the base.

* * * * *